(12) United States Patent
Yutani

(10) Patent No.: US 6,344,400 B1
(45) Date of Patent: Feb. 5, 2002

(54) METHOD OF MANUFACTURING CAPACITOR

(75) Inventor: Akie Yutani, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/539,885

(22) Filed: Mar. 31, 2000

(30) Foreign Application Priority Data

Nov. 9, 1999 (JP) .......................................... 11-318093

(51) Int. Cl.[7] .............................................. H01L 21/20
(52) U.S. Cl. ............................ 438/396; 438/3; 438/240
(58) Field of Search ............................ 438/3, 240, 396, 438/255, 650, 686, 680

(56) References Cited

U.S. PATENT DOCUMENTS 6,037,256 A * 3/2000 Weinrich et al. ............ 438/697
6,113,983 A * 9/2000 Zuchariah et al. .......... 427/253
6,232,198 B1 * 5/2001 Chang et al. ................ 438/396

FOREIGN PATENT DOCUMENTS

JP      10-289985      10/1998

* cited by examiner

Primary Examiner—Tuan H. Nguyen
(74) Attorney, Agent, or Firm—Oblon, Spivak, McClelland, Maier & Neustadt, P.C.

(57) ABSTRACT

Referring to a capacitor having a capacitor dielectric film made of a high dielectric film, it is possible to obtain a method of manufacturing a semiconductor device capable of forming a fine storage node made of a noble metal. A polysilicon film is formed over a whole face of an interlayer insulating film (9), and is then subjected to anisotropic dry etching by using, as a mask, a resist having a predetermined opening pattern. Consequently, a polysilicon film (22a) is formed in contact with a plug layer (11). Next, a noble metal element is substituted for a silicon element contained in the polysilicon film (22a). Thus, it is possible to form a storage node (22) which has at least a surface made of the noble metal element and has the same three-dimensional configuration as the polysilicon film (22a) obtained before the substitution.

7 Claims, 8 Drawing Sheets

F I G. 12
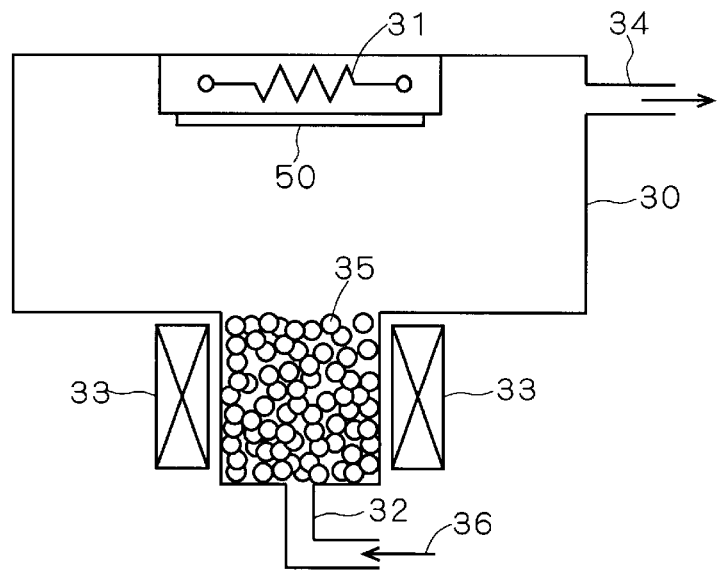
F I G. 13
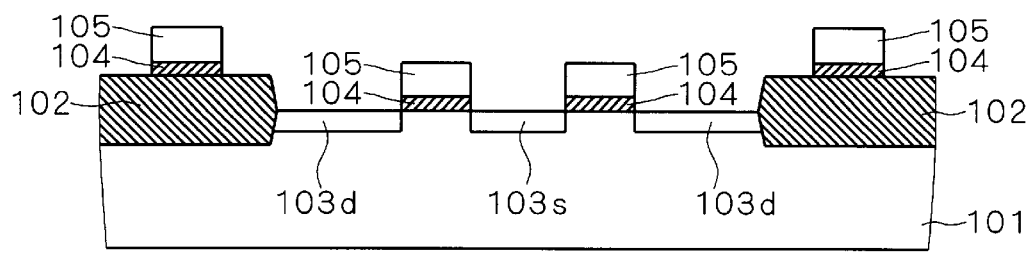
F I G. 14
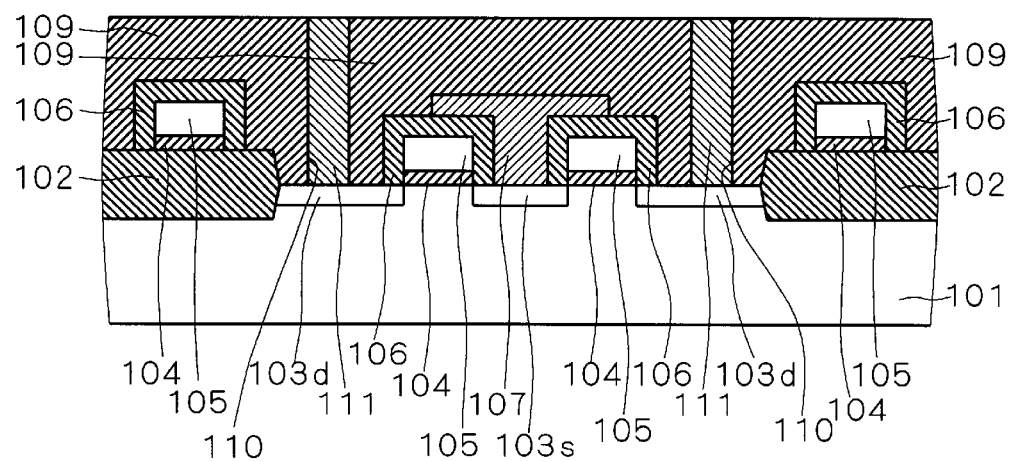

F I G. 15
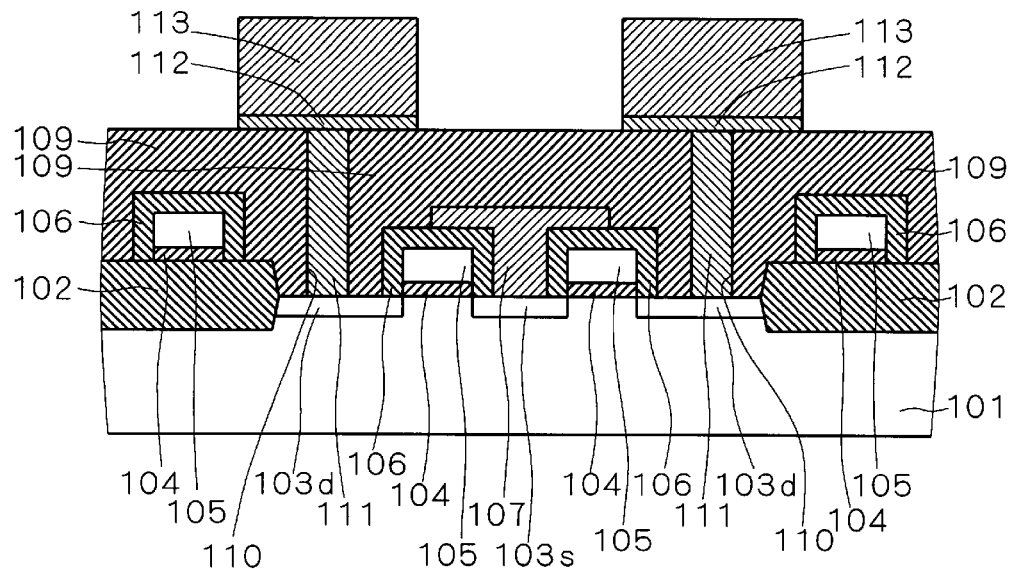
F I G. 16
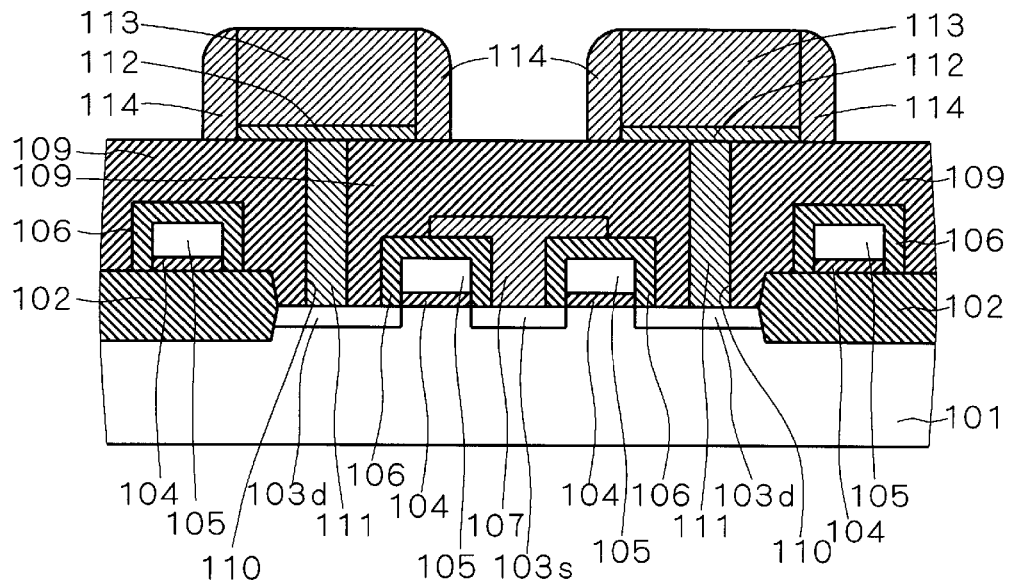

METHOD OF MANUFACTURING CAPACITOR

BACKGROUND OF THE INVENTION

1. Field of the Invention

The present invention relates to a method of manufacturing a capacitor, and more particularly to a method of manufacturing a capacitor comprising a capacitor dielectric film made of an oxide.

2. Description of the Background Art

FIGS. 13 to 17 are sectional views sequentially showing the steps of a method of manufacturing a semiconductor device comprising a capacitor according to the prior art. First of all, an element isolating film 102 is formed on an upper face of a semiconductor substrate 101. Then, a gate structure having a gate oxide film 104 and a gate electrode 105 provided in that order is selectively formed on the upper face of the semiconductor substrate 101 in an element forming region. Next, ions are implanted by using the gate structure and the element isolating film 102 as masks. Consequently, a source region 103s and a drain region 103d are formed in the upper face of the semiconductor substrate 101 (FIG. 13).

Subsequently, an insulating film 106 covering side and upper faces of the gate structure is formed, and a bit line 107 is then formed in contact with the source region 103s. Thereafter, an insulating film is deposited over the whole face and is then etched back. Consequently, an interlayer insulating film 109 is formed. Next, a contact hole 110 reaching an upper face of the drain region 103d from an upper face of the interlayer insulating film 109 is formed and a plug layer 111 to fill in the contact hole 110 is then formed (FIG. 14).

Next, a barrier metal layer is formed over the whole face. Then, a noble metal film is formed on the barrier metal layer by a sputtering method or a CVD method using an organic noble metal compound for a source. Then, a resist having a predetermined opening pattern is formed on the noble metal film. By using the resist as a mask, thereafter, the noble metal film and the barrier metal layer are subjected to etching in that order by an anisotropic dry etching method in a gas plasma atmosphere. Consequently, a barrier metal layer 112 to come in contact with the plug layer 111 and a storage node 113 are formed (FIG. 15).

Subsequently, a noble metal film is formed over the whole face by the sputtering method or the CVD method using an organic noble metal compound for a source. Then, the noble metal film is subjected to etching by the anisotropic dry etching method in the gas plasma atmosphere. Consequently, a side wall portion 114 is formed on side faces of the barrier metal layer 112 and the storage node 113 (FIG. 16). The side wall portion 114 functions as a first electrode of a capacitor together with the storage node 113.

Next, a capacitor dielectric film 115 made of a high dielectric film or a ferroelectric film is formed over the whole face. Subsequently, a cell plate 116 functioning as a second electrode of the capacitor is formed on the capacitor dielectric film 115. Then, an insulating film is formed on the cell plate 116, and is thereafter etched back, thereby forming an interlayer insulating film 117. Next, an aluminum wiring 118, an interlayer insulating film 119, an aluminum wiring 120 and a protective film 121 are formed in that order by a well-known method. Thus, a device is completed (FIG. 17).

However, such a method of manufacturing a semiconductor device according to the prior art has had the following problems.

First Problem

According to the method of manufacturing a semiconductor device according to the prior art, a noble metal film is processed by the anisotropic dry etching method at the steps shown in FIGS. 15 and 16. However, a noble metal generally has a very poor workability. For example, at the step of etching the noble metal film shown in FIG. 15, a reaction product generated by the etching is deposited on the side face of the storage node 113 or the like to form a re-deposited film so that the side face of the storage node 113 becomes tapered in some cases. A foreign matter removing method of removing the re-deposited film has also been known. However, a material of the re-deposited film is almost the same as that of the storage node 113 and depositing force for the storage node 113 is comparatively great. Therefore, removing force for removing the re-deposited film should be set great. For this reason, if a size of the storage node 113 is reduced with microfabrication of a semiconductor device, the storage node 113 itself is also removed at the foreign matter removing step. Accordingly, there has been a problem in that it is very difficult to form a fine storage node 113 having a half pitch of 0.25 μm or less (The half pitch means half of a formation pitch of a structure which is formed repetitively at regular intervals. In FIG. 15, for example, the half pitch is equivalent to half of a space between a left end of the storage node 113 on the left side and a left end of the storage node 113 on the right side).

Second Problem

As described with reference to the steps shown in FIGS. 15 and 16, the noble metal film can be formed by the sputtering method or the CVD method. In consideration of the goodness of step coverage, however, it is desirable that the noble metal film should be formed by the CVD method. An example of a method of forming a storage node using the step of depositing a noble metal film by the CVD method has been disclosed in Japanese Laid-Open Patent Publication No. Hei 10-289985. In the case where the noble metal film is to be formed by the CVD method, an organic noble metal compound has conventionally been used as a source of the CVD.

However, if the organic noble metal compound is used as the source of the CVD, carbon or an organic molecule which is contained in the source of the CVD remains in the storage node 113 and the side wall potion 114. There has been a problem in that the remaining carbon or organic molecule causes an oxidation reaction when the capacitor dielectric film 115 is deposited at the next step, thereby generating carbon dioxide and water.

Under the present circumstances, all the high dielectric films or ferroelectric films which are the materials of the capacitor dielectric film 115 are oxides. Accordingly, when the capacitor dielectric film 115 is to be formed, it is essential that the atmosphere should be set to have oxidation properties. Therefore, it is impossible to prevent the carbon dioxide and water from being generated by the carbon or organic molecule remaining in the storage node 113 and the side wall portion 114. In addition, the noble metal generally has a high catalytic action for an oxidation-reduction reaction. For this reason, the oxidation reaction is caused more easily.

The carbon dioxide and the water which are generated by the oxidation reaction affect a semiconductor device in the following manner. Referring to a bad influence of the carbon dioxide, first of all, the carbon dioxide is an acidic gas and easily reacts to a high dielectric film or a ferroelectric film which is a basic oxide, thereby generating a carbonate. For example, in the case where barium strontium titanate ((Ba, Sr) $TiO_3$: BST) is used as the high dielectric film, an acid-base reaction represented by the following reaction formula is easily caused.

$$(Ba, Sr)TiO_3 + CO_2 \rightarrow (BaCO_3 + SrCO_3) + TiO_2$$

(A reaction factor is omitted.)

As a result, a carbonate of an alkaline earth metal is generated in the high dielectric film or the ferroelectric film. The carbonate causes a decrease in a dielectric constant and a deterioration in a breakdown voltage and reliability.

Referring to a bad influence of the water, when the generated water is decomposed on a surface of the storage node 113 to generate hydrogen, the hydrogen reduces the high dielectric film or the ferroelectric film, resulting in a deterioration in a breakdown voltage. Furthermore, if the carbonate is generated as described above, the water dissolves the carbonate. Therefore, the water has a seriously bad influence such as peeling of a film as well as the deterioration in a breakdown voltage and reliability.

SUMMARY OF THE NVENTION

A first aspect of the present invention is directed to a method of manufacturing a capacitor, comprising the steps of (a) processing a predetermined film made of a material having a more excellent workability than a noble metal film to form a structure in a region in which a first electrode of a capacitor is to be formed on a main surface of an underlying layer, (b) substituting a noble metal element for a predetermined element contained in the structure, thereby forming the first electrode, (c) forming a capacitor dielectric film made of an oxide on the first electrode after the step (b), and (d) forming a second electrode of the capacitor on the capacitor dielectric film.

A second aspect of the present invention is directed to the method of manufacturing a capacitor according to the first aspect of the present invention, wherein the step (b) is executed by exposing the first electrode into a noble metal halide atmosphere while heating the first electrode.

A third aspect of the present invention is directed to the method of manufacturing a capacitor according to the second aspect of the present invention, wherein the noble metal halide is an inorganic noble metal halide.

A fourth aspect of the present invention is directed to the method of manufacturing a capacitor according to the second aspect of the present invention, wherein, at the step (b), the noble metal halide is generated by causing a noble metal element and a halogen gas to react to each other in a reaction chamber in which the capacitor is put.

A fifth aspect of the present invention is directed to a method of manufacturing a capacitor, comprising the steps of (a) forming a first electrode of a capacitor on a main surface of an underlying layer by utilizing a CVD method using an inorganic noble metal halide for a source, (b) forming a capacitor dielectric film made of an oxide on the first electrode, and (c) forming a second electrode of the capacitor on the capacitor dielectric film.

A sixth aspect of the present invention is directed to the method of manufacturing a capacitor according to the fifth aspect of the present invention, wherein, at the step (a), the inorganic noble metal halide is generated by causing an inorganic noble metal element and a halogen gas to react to each other in a reaction chamber in which the capacitor is put.

According to the first aspect of the present invention, the first electrode made of the noble metal element can be formed without executing the step of processing a noble metal film having a poor workability. Moreover, the first electrode has the same three-dimensional configuration as the structure. Therefore, the first electrode which is fine can also be formed by finely processing a predetermined film having an excellent workability.

According to the second aspect of the present invention, the noble metal halide has very great oxidizing force. Therefore, the noble metal halide can easily react to the predetermined element contained in the structure to precipitate a noble metal, and can evaporate the predetermined element contained in the structure as a halide having a high vapor pressure from the structure.

According to the third aspect of the present invention, it is possible to avoid the execution of the step of depositing a noble metal film by the CVD method using an organic noble metal compound for a source. Therefore, it is possible to solve various problems of the conventional method of manufacturing a capacitor which are caused by the generation of a carbonate and water.

According to the fourth aspect of the present invention, the noble metal halide used as the raw material is not directly introduced into the reaction chamber but a noble metal element and a halogen gas which are more inexpensive and can be handled more easily than the noble metal halide are used as raw materials and are caused to react to each other in the reaction chamber. Consequently, a noble metal halide is generated. Accordingly, it is possible to avoid the use, as a raw material, of the noble metal halide which is expensive and is to be handled with care. Thus, it is possible to obtain a reduction in a cost and the like.

According to the fifth aspect of the present invention, it is possible to avoid the execution of the step of depositing a noble metal film by a CVD method using an organic noble metal compound for a source. Therefore, it is possible to solve various problems of the conventional method of manufacturing a capacitor which are caused by the generation of a carbonate and water.

According to the sixth aspect of the present invention, the inorganic noble metal halide used as the raw material is not directly introduced into the reaction chamber but an inorganic noble metal element and a halogen gas which are more inexpensive and can be handled more easily than the inorganic noble metal halide are used as raw materials and are caused to react to each other in the reaction chamber. Thus, an inorganic noble metal halide is generated. Accordingly, it is possible to avoid the use, as a raw material, of the inorganic noble metal halide which is expensive and is to be handled with care. Thus, it is possible to obtain a reduction in a cost and the like.

In order to solve the above-mentioned problems, it is an object of the present invention to provide a method of manufacturing a semiconductor device comprising a capacitor having a capacitor dielectric film made of an oxide in which it is possible to form a fine storage node made of a noble metal and to avoid the execution of the step of depositing a noble metal film by a CVD method using an organic noble metal compound for a source.

These and other objects, features, aspects and advantages of the present invention will become more apparent from the following detailed description of the present invention when taken in conjunction with the accompanying drawings.

BRIEF DESCRIPTION OF THE DRAWINGS

FIG. 12 is a side view schematically showing a structure of a semiconductor manufacturing apparatus to be used in a method of manufacturing a semiconductor device according to a third embodiment of the present invention; and FIGS. 13 to 17 are sectional views sequentially showing the steps of a method of manufacturing a semiconductor device according to the prior art.

DESCRIPTION OF THE PREFERRED EMBODIMENTS

First Embodiment

By taking, as an example, a process of manufacturing a DRAM which is a semiconductor device comprising a capacitor, a method of manufacturing a semiconductor device according to a first embodiment of the present invention will be described below.

Figure 1:
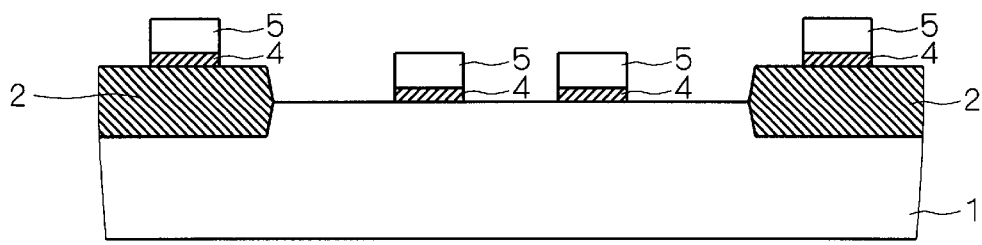
FIGS. 1 to 7 are sectional views sequentially showing the steps of a method of manufacturing a semiconductor device according to a first embodiment of the present invention.

FIGS. 1 to 7 are sectional views sequentially showing the steps of the method of manufacturing a capacitor according to the first embodiment of the present invention. First of all, an element isolating film 2 made of a silicon oxide film is formed on an upper face of a semiconductor substrate 1 made of silicon by a LOCOS method or a STI (Shallow Trench Isolation) method. Next, the upper face of the semiconductor substrate 1 in an element forming region defined by the element isolating film 2 is subjected to thermal oxidation, thereby forming a silicon oxide film. Then, a polysilicon film is formed on the silicon oxide film by a CVD method. Thereafter, the polysilicon film and the silicon oxide film are subjected to patterning by photolithography and a dry etching method. Consequently, a gate structure having a gate oxide film 4 and a gate electrode 5 provided in that order is selectively formed on the upper face of the semiconductor substrate 1 in the element forming region (FIG. 1). In FIG. 1, the gate structure formed on the element isolating film 2 is obtained by a gate structure of a memory cell present on an inner part of a paper or this side thereof which is extended to appear on the element isolating film 2.

Figure 2:
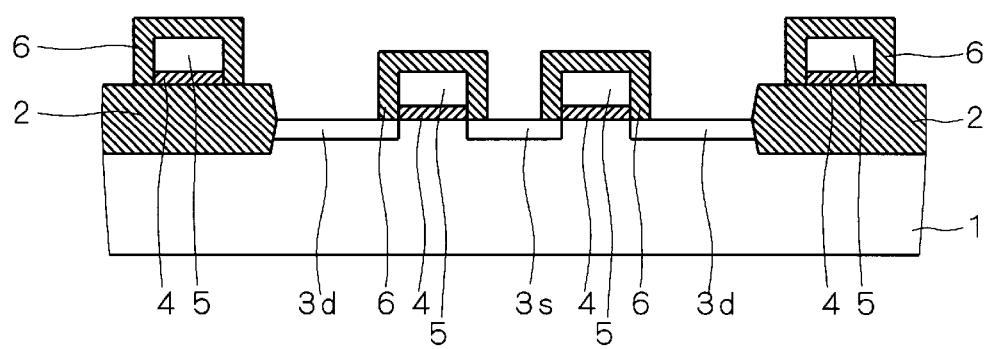

Next, ions are implanted into the upper face of the semiconductor substrate 1 using the gate structure and the element isolating film 2 as masks by ion implantation. Consequently, a source region 3s and a drain region 3d are formed. An implantation concentration of the ions is in order of $10^{15}/cm^2$. Then, an insulating film such as TEOS, BPTEOS or the like is deposited over the whole face by the CVD method. Thereafter, a resist having a predetermined opening pattern is formed on the insulating film. Subsequently, anisotropic dry etching is carried out by using the resist as a mask, thereby forming an insulating film 6 covering side and upper faces of the gate structure (FIG. 2).

Figure 3:
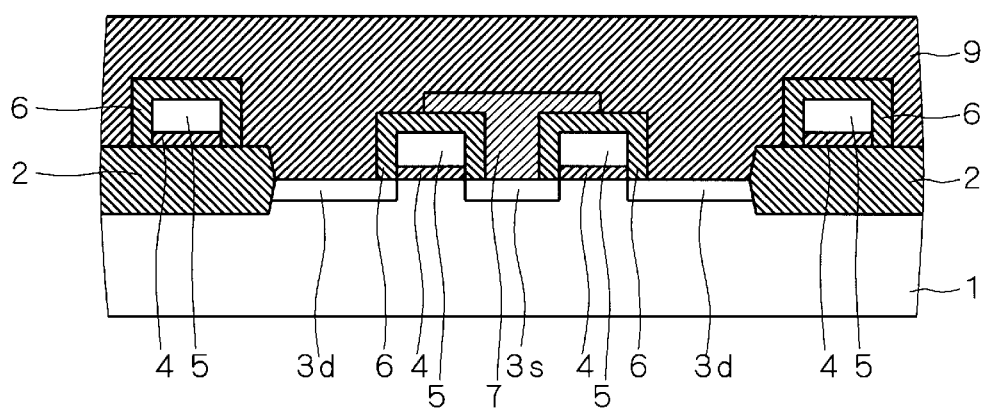

Next, a conductive film such as polysilicon, tungsten or the like is deposited over the whole face by the CVD method. Then, the conductive film is subjected to patterning by the photolithography and the dry etching method, thereby forming a bit line 7 in contact with the source region 3s. Thereafter, an insulating film such as TEOS or the like is deposited over the whole face by the CVD method. Subsequently, the insulating film is etched back or is subjected to reflow or CMP. Consequently, an upper face of the insulating film is flattened to form an interlayer insulating film 9 (FIG. 3).

Figure 4:
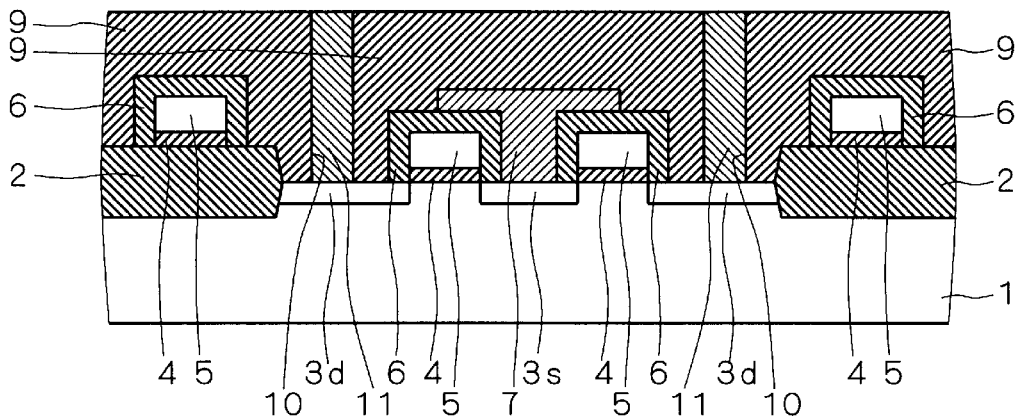

Next, a resist having a predetermined opening pattern is formed on the interlayer insulating film 9 by the photolithography. Then, the interlayer insulating film 9 is subjected to anisotropic dry etching by using the resist as a mask, thereby forming a contact hole 10 reaching an upper face of the drain region 3d from an upper face of the interlayer insulating film 9. Thereafter, a conductive film such as a titanium film, a titanium nitride film or the like is formed to fill in the contact hole 10 and to cover the upper face of the interlayer insulating film 9 by the CVD method or a sputtering method. Subsequently, an upper face of the conductive film is flattened by a CMP method, for example, until the upper face of the interlayer insulating film 9 is exposed. Thus, a plug layer 11 is formed in the contact hole 10 (FIG. 4). Alternatively, a plug layer having a structure in which a barrier metal layer is deposited on doped polysilicon may be formed in the contact hole 10.

Figure 5:
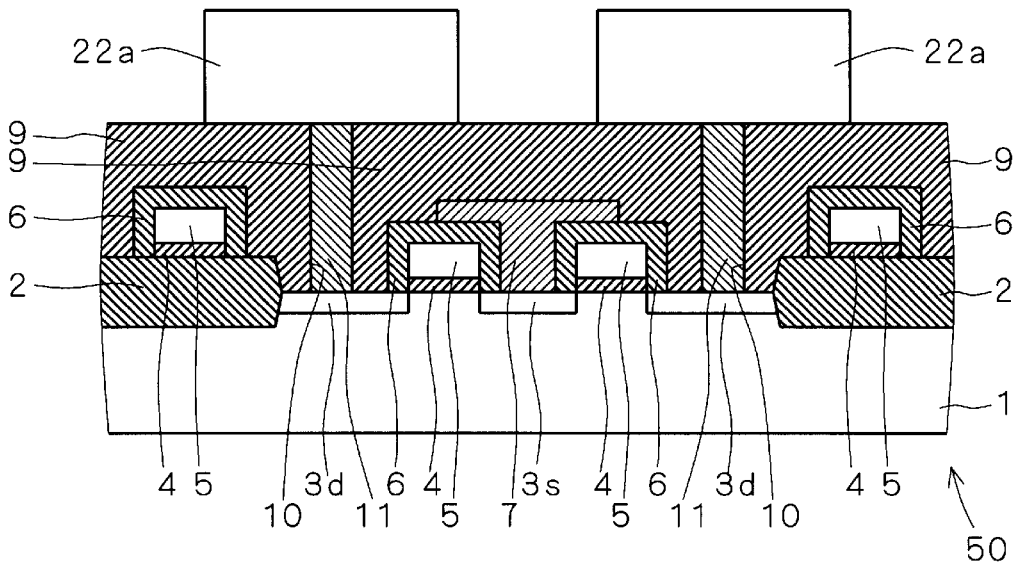

Next, a polysilicon film is formed over the whole face by the CVD method. Then, a resist having a predetermined opening pattern is formed on the polysilicon film by photolithography. Then, the polysilicon film is subjected to the anisotropic dry etching by using the resist as a mask until the upper face of the interlayer insulating film 9 is exposed. Thus, a polysilicon film 22a is formed in contact with the plug layer 11 (FIG. 5). Since the polysilicon film has a more excellent workability than noble metals, ultramicrofabrication having a half pitch of 0.25 μm or less can also be carried out comparatively easily.

Subsequently, a noble metal element such as iridium (Ir), platinum (Pt) or the like is substituted for a silicon element contained in the polysilicon film 22a. More specifically, a semiconductor device 50 shown in FIG. 5 is put in a reaction chamber and is heated by a heater, and at the same time, a gas of a noble metal halide such as iridium hexafluoride (IrF$_6$), platinum hexafluoride (PtF$_6$) or the like is introduced into the reaction chamber. In general, the polysilicon film is easily oxidized and a noble metal halide has very great oxidizing force. For this reason, the noble metal halide easily reacts to silicon, thereby precipitating a noble metal. At this time, moreover, the silicon is changed to a halide having a high vapor pressure to evaporate. For example, in the case where the iridium hexafluoride is used as the noble metal halide, an oxidation-reduction reaction expressed by the following reaction formula gradually proceeds from a surface of the polysilicon film 22a toward an inside thereof so that an iridium element is substituted for a silicon element.

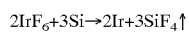

$$2IrF_6 + 3Si \rightarrow 2Ir + 3SiF_4 \uparrow$$

Figure 6:
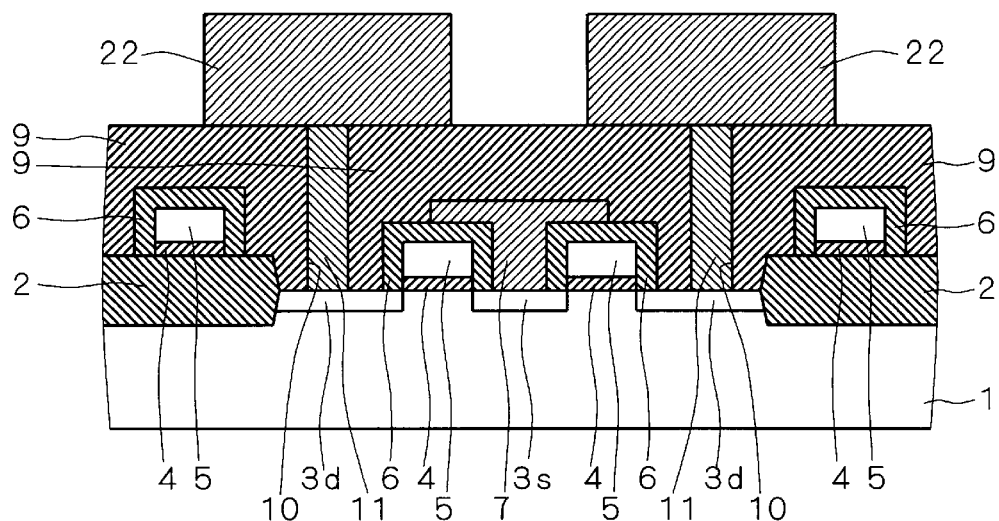

Thus, the polysilicon film 22a is heated and exposed into a noble metal halide atmosphere at the same time. Consequently, the noble metal element is substituted for the silicon element contained in the polysilicon film 22a so that it is possible to form a storage node 22 having at least a surface made of a noble metal element and the same three-dimensional configuration as the polysilicon film 22a obtained before the substitution (FIG. 6). The storage node 22 functions as a first electrode of a capacitor.

Figure 7:
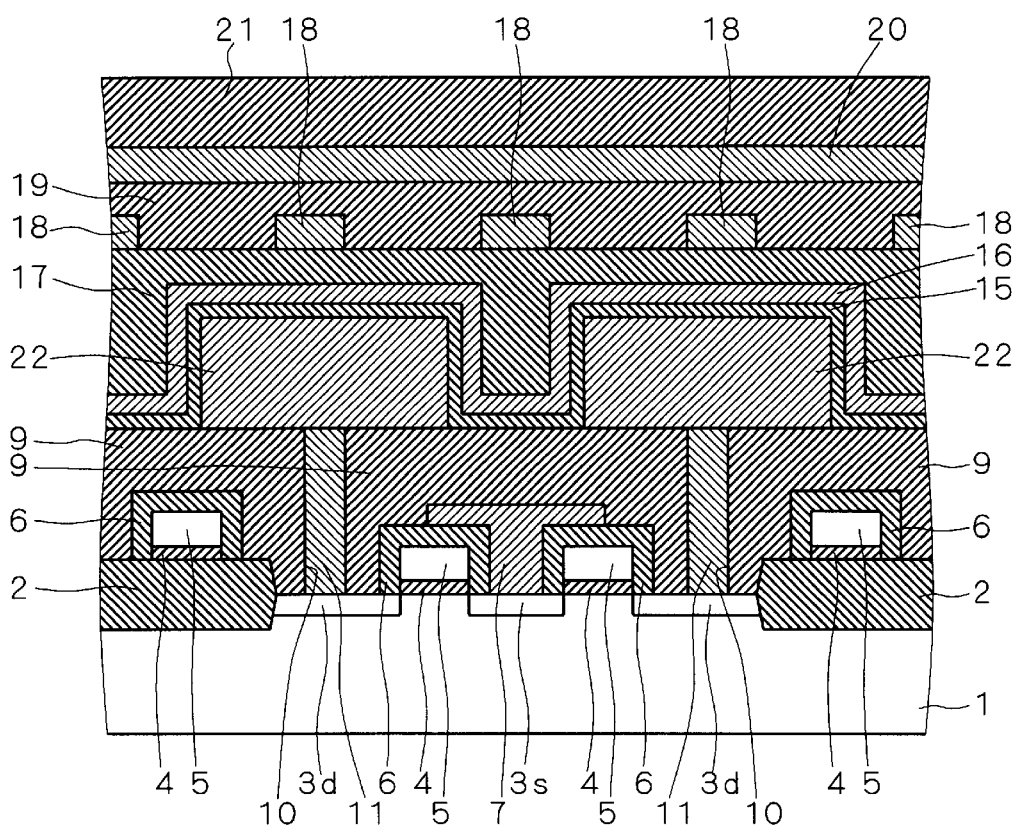

Next, a high dielectric film such as barium strontium titanate or a ferroelectric film is formed over the whole face to cover the storage node 22. Consequently, a capacitor dielectric film 15 is formed. Then, a noble metal film is deposited over the whole face to cover the capacitor dielectric film 15 by the CVD method. Thus, a cell plate 16 is formed opposite to the storage node 22 with the capacitor dielectric film 15 interposed therebetween. The cell plate 16 functions as a second electrode of the capacitor. Next, an insulating film is formed on the cell plate 16. Then, an upper face of the insulating film is flattened by the CMP method, for example, thereby forming an interlayer insulating film 17. Thereafter, an aluminum wiring 18, an interlayer insulating film 19, an aluminum wiring 20 and a protective film 21 made of a silicon nitride film, polyimide or the like are formed in that order by a well-known method. Thus, a device is completed (FIG. 7).

According to the method of manufacturing a semiconductor device in accordance with the first embodiment of the present invention, thus, the polysilicon film having an excellent workability is formed on the interlayer insulating film 9 and is then subjected to the anisotropic dry etching, thereby processing the polysilicon film 22a, and the noble metal element is then substituted for the silicon element contained in the polysilicon film 22a. Therefore, the storage node 22 having at least a surface made of a noble metal element can be formed without executing the step of etching a noble metal film having a poor workability.

Moreover, the storage node 22 has the same three-dimensional configuration as the polysilicon film 22a obtained before the element substitution. Therefore, the fine storage node 22 having a half pitch of 0.25 $\mu$m or less can also be formed comparatively easily.

Furthermore, it is possible to avoid the execution of the step of depositing a noble metal film by the CVD method using an organic noble metal compound for a source. Therefore, it is also possible to solve various problems of the conventional method of manufacturing a semiconductor device which are caused by the generation of a carbonate and water.

Second Embodiment

Figure 8:
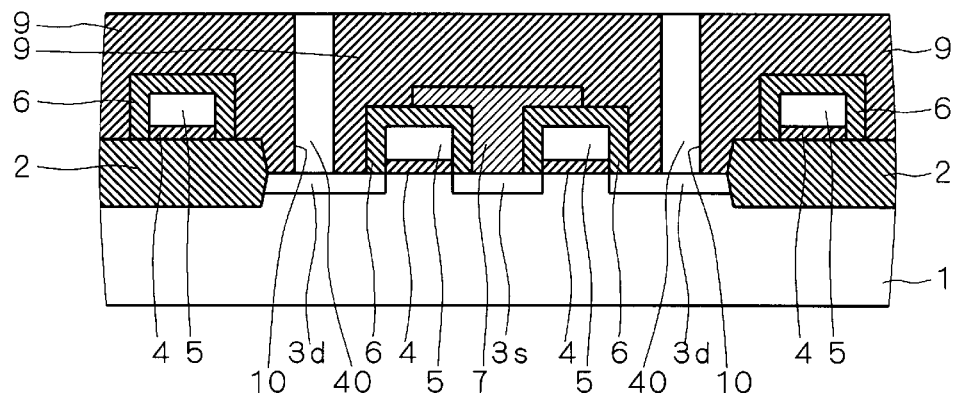
FIGS. 8 to 11 are sectional views sequentially showing the steps of a method of manufacturing a semiconductor device according to a second embodiment of the present invention.

FIGS. 8 to 11 are sectional views sequentially showing the steps of a method of manufacturing a semiconductor device according to a second embodiment of the present invention. First of all, the same structure as shown in FIG. 3 is obtained by the same method as in the first embodiment. Next, a resist having a predetermined opening pattern is formed on an interlayer insulating film 9 by photolithography. Then, the interlayer insulating film 9 is subjected to anisotropic dry etching by using the resist as a mask, thereby forming a contact hole 10 reaching an upper face of a drain region 3d from an upper face of the interlayer insulating film 9. Thereafter, a doped polysilicon film is formed to fill in the contact hole 10 and to cover the upper face of the interlayer insulating film 9 by a CVD method or a sputtering method. Subsequently, an upper face of the doped polysilicon film is flattened by a CMP method, for example, until the upper face of the interlayer insulating film 9 is exposed. Consequently, a plug layer 40 is formed in the contact hole 10 (FIG. 8).

Next, a barrier metal layer made of titanium, titanium nitride or the like is formed over the whole face by the CVD method. Then, a noble metal film is deposited on the barrier metal layer by the CVD method using, for a source, a gas of an inorganic noble metal halide (for example, iridium hexafluoride, platinum hexafluoride or the like) or a liquid having a high vapor pressure. Thereafter, a resist having a predetermined opening pattern is formed on the noble metal film. Next, the noble metal film and the barrier metal layer are subjected to etching in that order by an anisotropic dry etching method in a gas plasma atmosphere with the resist used as a mask. Consequently, a barrier metal layer 12 and a storage node 13 are formed (FIG. 9).

Figure 10:
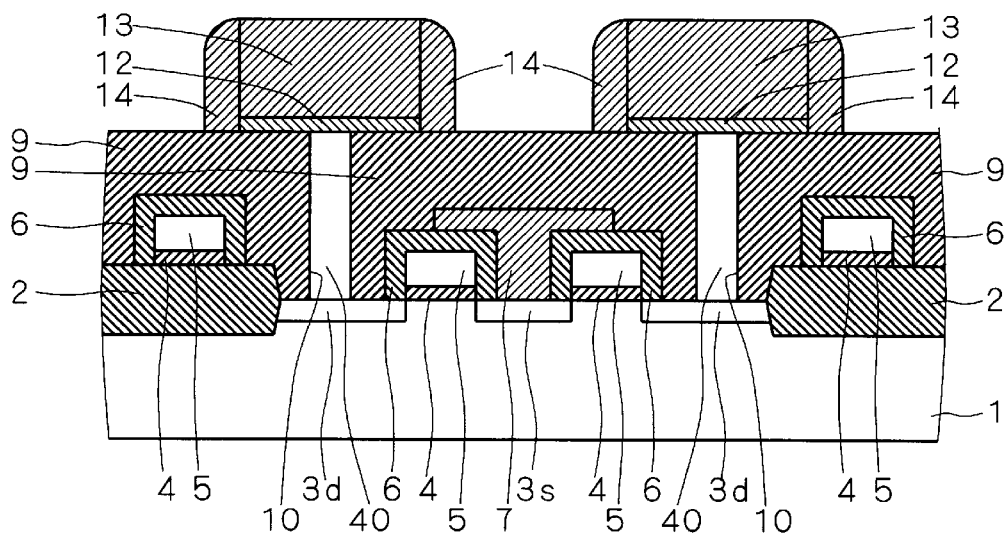

Subsequently, a noble metal film is deposited over the whole face by the CVD method using an inorganic noble metal compound for the source. Then, the noble metal film is subjected to etching by the anisotropic dry etching method in the gas plasma atmosphere. Consequently, a side wall portion 14 is formed on side faces of the barrier metal layer 12 and the storage node 13 (FIG. 10). The side wall portion 14 functions as a first electrode of a capacitor together with the storage node 13.

Figure 11:
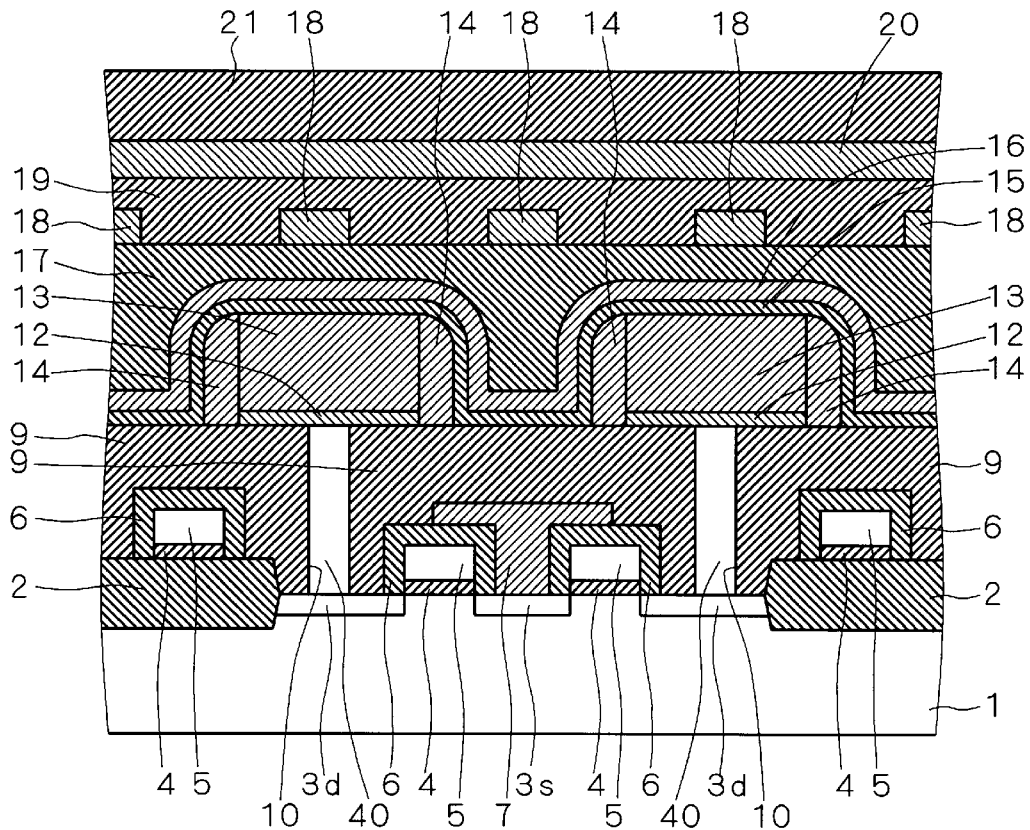
Figure 17:
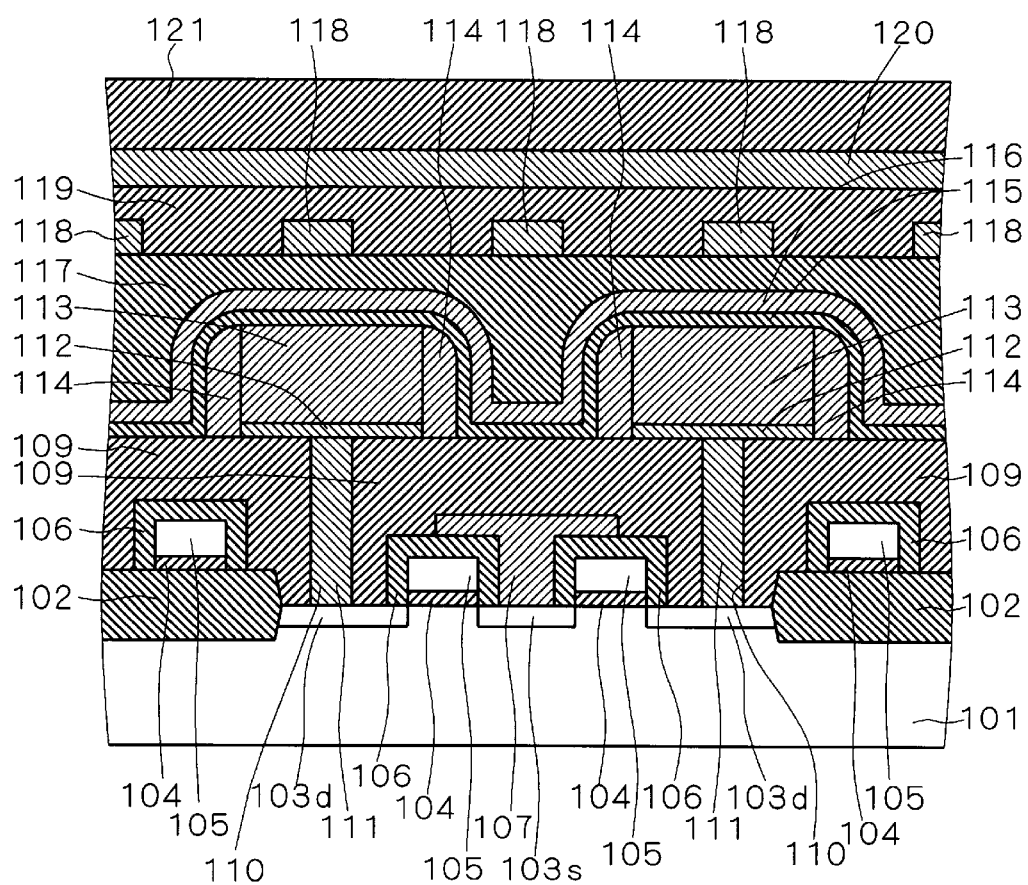

Thereafter, a capacitor dielectric film 15, a cell plate 16, an interlayer insulating film 17, an aluminum wiring 18, an interlayer insulating film 19, an aluminum wiring 20 and a protective film 21 are formed in that order in the same manner as in the first embodiment. Thus, a device is completed (FIG. 11).

Figure 9:
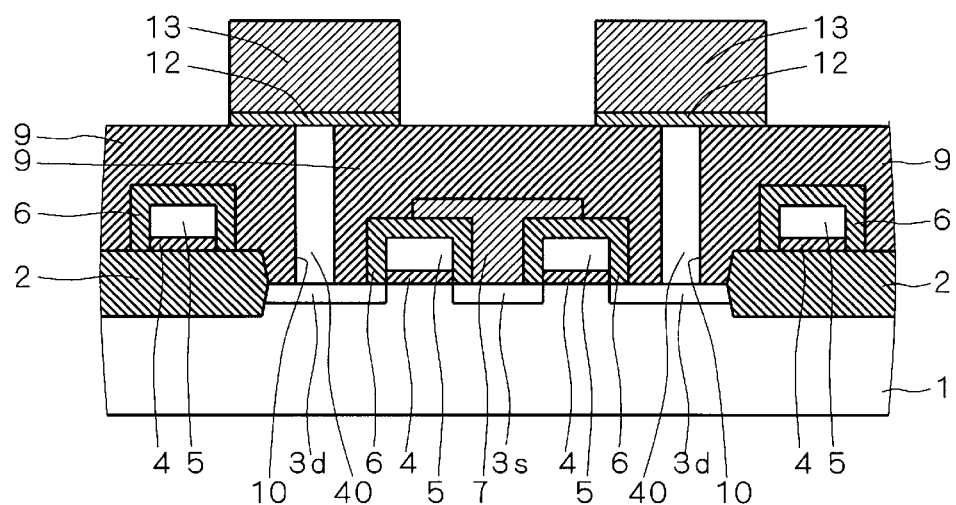

According to the method of manufacturing a semiconductor device in accordance with the second embodiment of the present invention, thus, the noble metal film is deposited on the barrier metal layer by the CVD method using the inorganic noble metal halide for the source at the step shown in FIG. 9 in order to form the storage node 13. In order to form the side wall portion 14, moreover, the noble metal film is deposited over the whole face by the CVD method using the inorganic noble metal halide for the source at the step shown in FIG. 10. Accordingly, it is possible to avoid the execution of the step of depositing a noble metal film by the CVD method using an organic noble metal compound for a source. Therefore, it is possible to solve various problems of the conventional method of manufacturing a semiconductor device which are caused by the generation of a carbonate and water.

Furthermore, equipment for vaporizing an organic noble metal gas (for example, a heater, a solution vaporizer or the like) is not required. Therefore, the device can also be simplified.

Third Embodiment

In the first embodiment, the noble metal halide is used as the reaction gas for substituting the noble metal element for the silicon element contained in the polysilicon film 22a (FIG. 6). In the second embodiment, moreover, the noble metal halide is used as the source of the CVD when the noble metal film is deposited on the barrier metal layer and as the source of the CVD when the noble metal film is deposited to form the side wall portion 14 (FIGS. 9 and 10). In general, however, the noble metal halide is very expensive, and furthermore, should be handled with care because of great oxidizing force thereof. Accordingly, it is more desirable that the use of the noble metal halide as a raw material should be avoided.

FIG. 12 is a side view schematically showing a structure of a semiconductor manufacturing apparatus to be used in a method of manufacturing a semiconductor device according to a third embodiment of the present invention. Referring to the method of manufacturing a semiconductor device according to the first embodiment, description will be given by taking, as an example, the case where the step of substituting the noble metal element for the silicon element contained in the polysilicon film 22a is executed by using the semiconductor manufacturing apparatus shown in FIG. 12.

A heater 31 is provided in a reaction chamber 30, and the semiconductor device 50 shown in FIG. 5 is provided in the vicinity of a lower portion of the heater 31 with the upper face of the polysilicon film 22a turned downward in the reaction chamber 30. Moreover, an inlet 32 for introducing a halogen gas 36 from the outside into the reaction chamber 30 is provided on a bottom face of the reaction chamber 30. A noble metal element 35 is put into the reaction chamber 30 in the vicinity of an upper portion of the inlet 32. A diluted gas obtained by diluting the halogen gas 36 with an inert gas such as nitrogen may be put in place of the halogen gas 36. Consequently, a controllability can be enhanced so that a reaction rate can easily be regulated. Moreover, a heater 33 for heating the noble metal element 35 and the halogen gas 36 is provided around an outer face of the reaction chamber 30 in a portion where the noble metal element 35 is put. Furthermore, an outlet 34 connected to a device for collecting a noble metal (not shown) is provided in an upper portion of the reaction chamber 30. If a vapor pressure of the generated noble metal halide is low, a heater for heating the whole reaction chamber 30 may be provided therearound.

Next, an operation will be described. First of all, the halogen gas 36 is introduced from the outside into the reaction chamber 30 through the inlet 32 with the heaters 31 and 33 driven. Consequently, the noble metal element 35 reacts to the halogen gas 36, thereby generating a noble metal halide. For example, in the case where an iridium element is used as the noble metal element 35 and a fluorine (F) gas is used as the halogen gas 36, heating is carried out at a temperature of 300° C. to 400° C. by the heater 33 so that a chemical reaction expressed by the following reaction formula is caused. Consequently, iridium hexafluoride which is the noble metal halide can be generated.

$$Ir + 3F_2 \rightarrow IrF_6 \uparrow$$

The semiconductor device 50 is exposed into the iridium hexafluoride atmosphere so that the iridium element can be substituted for the silicon element contained in the polysilicon film 22a as described in the first embodiment.

According to the method of manufacturing a semiconductor device in accordance with the third embodiment of the present invention, thus, the noble metal halide used as the raw material is not directly introduced from the outside into the reaction chamber 30 but a noble metal element and a halogen gas which are more inexpensive and can be handled more easily than the noble metal halide are used as raw materials and are caused to react to each other in the reaction chamber 30. Thus, a noble metal halide is generated. The noble metal halide thus generated is used as a reaction gas for substituting the noble metal element for the silicon element contained in the polysilicon film 22a, as a source of CVD when a noble metal film is deposited on a barrier metal layer or as the source of the CVD when a noble metal film is deposited to form a side wall portion 14. Accordingly, it is possible to avoid the use, as a raw material, of the noble metal halide which is expensive and is to be handled with care. Thus, it is possible to obtain a reduction in a cost and the like.

While the invention has been described in detail, the foregoing description is in all aspects illustrative and not restrictive. It is understood that numerous other modifications and variations can be devised without departing from the scope of the invention.

What is claimed is:

1. A method of manufacturing a capacitor, comprising the steps of:
   (a) processing a predetermined film made of a material having a workability greater than a workability of a noble metal film to form a structure in a region in which a first electrode of a capacitor is to be formed on a main surface of an underlying layer;
   (b) substituting a noble metal element for a predetermined element contained in said structure, thereby forming said first electrode;
   (c) forming a capacitor dielectric film made of an oxide on said first electrode after said step (b); and
   (d) forming a second electrode of said capacitor on said capacitor dielectric film,
   wherein said step (b) is executed by exposing said first electrode into a noble metal halide atmosphere while heating said first electrode; and
   at step (b), said noble metal halide is generated by causing a noble metal element and a halogen gas to react to each other in a reaction chamber in which said capacitor is put.

2. The method of manufacturing a capacitor according to claim 1, wherein said noble metal halide is an inorganic noble metal halide.

3. The method of manufacturing a capacitor according to claim 1, wherein said predetermined film is a polysilicon film.

4. The method of manufacturing a capacitor according to claim 1, wherein said capacitor dielectric film is either a high dielectric film or a ferroelectric film.

5. The method of manufacturing a capacitor according to claim 1, wherein said structure formed at said step (a) includes a plurality of structures, and
   said plurality of structures which are adjacent to each other have a half pitch of not greater than 0.25 $\mu$m.

6. A method of manufacturing a capacitor, comprising the steps of:
   (a) forming a first electrode of a capacitor on a main surface of an underlying layer by utilizing a CVD method using an inorganic noble metal halide for a source;
   (b) forming a capacitor dielectric film made of an oxide on said first electrode; and
   (c) forming a second electrode of said capacitor on said capacitor dielectric film.

7. The method of manufacturing a capacitor according to claim 6, wherein, at said step (a), said inorganic noble metal halide is generated by causing an inorganic noble metal element and a halogen gas to react to each other in a reaction chamber in which said capacitor is put.

* * * * *